(12) United States Patent
Kushibiki et al.

(10) Patent No.: US 8,252,698 B2
(45) Date of Patent: Aug. 28, 2012

(54) SUBSTRATE PROCESSING METHOD

(75) Inventors: Masato Kushibiki, Nirasaki (JP); Eiichi Nishimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 12/558,047

(22) Filed: Sep. 11, 2009

(65) Prior Publication Data

US 2010/0068892 A1   Mar. 18, 2010

Related U.S. Application Data

(60) Provisional application No. 61/112,970, filed on Nov. 10, 2008.

(30) Foreign Application Priority Data

Sep. 12, 2008   (JP) .................................. 2008-234809

(51) Int. Cl.
*H01L 21/302* (2006.01)
(52) U.S. Cl. ................. 438/758; 438/695; 257/E21.214
(58) Field of Classification Search .................. 438/758, 438/702, 710, 695; 257/E21.214
See application file for complete search history.

(56) References Cited

U.S. PATENT DOCUMENTS

| | | | |
|---|---|---|---|
| 4,666,555 A | | 5/1987 | Tsang |
| 5,520,771 A | * | 5/1996 | Kanai et al. ............. 156/345.41 |
| 2005/0103748 A1 | | 5/2005 | Yamaguchi et al. |
| 2005/0274691 A1 | * | 12/2005 | Park ................................. 216/41 |
| 2006/0089005 A1 | * | 4/2006 | Kanarik et al. ................ 438/714 |
| 2006/0163202 A1 | * | 7/2006 | Shimizu et al. .................. 216/67 |
| 2007/0163995 A1 | * | 7/2007 | Sugimoto et al. ................ 216/67 |
| 2009/0035944 A1 | * | 2/2009 | Chiang et al. ................. 438/703 |
| 2010/0048026 A1 | * | 2/2010 | Sone et al. .................... 438/710 |

FOREIGN PATENT DOCUMENTS

| | | |
|---|---|---|
| CN | 86 1 03233 A | 2/1987 |
| CN | 101005028 A | 7/2007 |
| CN | 101154569 A | 4/2008 |

OTHER PUBLICATIONS

Office Action issued Aug. 11, 2010, in China Patent Application No. 200910170539.0 (with English translation).
Office Action issued Oct. 25, 2011, in Chinese Patent Application No. 200910170539.0 with English translation.

* cited by examiner

*Primary Examiner* — William D Coleman
*Assistant Examiner* — Christine Enad
(74) *Attorney, Agent, or Firm* — Oblon, Spivak, McClelland, Maier & Neustadt, L.L.P.

(57) ABSTRACT

In a substrate processing method of processing a substrate in which a processing target layer, an intermediate layer, and a mask layer are stacked one on top of another, the mask layer having an opening that partially exposes the intermediate layer, a thickness of the mask layer is increased by depositing deposits on an upper surface of the mask layer with plasma generated from a mixed gas of $SF_6$ gas and a depositive gas represented in a general equation, $C_xH_yF_z$ (where, x, y, and z are positive integers).

20 Claims, 6 Drawing Sheets

SUBSTRATE PROCESSING METHOD

CROSS-REFERENCE TO RELATED APPLICATIONS

This application claims priority to Japanese Patent Application No. 2008-234809, filed on Sep. 12, 2008, the entire contents of which are incorporated by herein reference.

FIELD OF THE INVENTION

The present invention relates to a substrate processing method, and particularly, to a substrate processing method of processing a substrate in which a processing target layer, an intermediate layer, and a mask layer are stacked one on top of another.

BACKGROUND OF THE INVENTION

There is known a wafer for semiconductor devices, which includes an oxide film, e.g., a TEOS (Tetra Ethyl Ortho Silicate) film, which contains impurities formed on a silicon base by a CVD process or the like; a conductive film, such as a TiN film; an antireflection film (BARC film); and a mask layer (photoresist film) that are stacked one on top of another (see, e.g., Japanese Patent Application Publication No. 2006-190939). The photoresist film is formed to have a predetermined pattern by photolithography, and serves as a mask layer upon etching the antireflection film and the conductive film.

Recently, semiconductor devices are becoming smaller and smaller, and it is required to form a circuit pattern on the surface of the wafer more finely. To form such a fine circuit pattern, it is needed to make the minimum dimension of pattern in the photoresist film small in the fabrication of the semiconductor devices so that an opening (via hole or trench) with a small dimension may be formed in an etching target film.

The minimum dimension of pattern in the photoresist film is defined depending on the minimum dimension that may be developed in photolithography, however, the minimum dimension that may be accomplished by photolithography in a mass-production has a limitation due to a deviation in a focal length. For example, the minimum dimension achievable is about 80 nm. Meanwhile, a processing dimension that satisfies the requirement of scaling-down for miniaturization of semiconductor devices is about 30 nm.

Further, photoresist films smoother and thinner than those of the prior art have been widely applied and the wavelength of light used for photolithography has been shortened in order to reduce the minimum dimension of the pattern. This causes a problem that the photoresist film itself is worn when the antireflection film (BARC film) is etched. Thus, it has been accelerated to develop a technology to increase or recover the thickness of the photoresist film.

SUMMARY OF THE INVENTION

In view of the above, the present invention provides a substrate processing method for forming an opening with a dimension satisfying the requirement of scaling-down for miniaturization of semiconductor devices, which may increase the thickness of a mask layer before the mask layer is worn or recover the mask layer worn.

In accordance with an embodiment of the invention, there is provided a substrate processing method of processing a substrate in which a processing target layer, an intermediate layer, and a mask layer are stacked one on top of another, the mask layer having an opening that partially exposes the intermediate layer, includes increasing a thickness of the mask layer by depositing deposits on an upper surface of the mask layer having the opening with plasma generated from a mixed gas of $SF_6$ gas and a depositive gas represented in a general equation, $C_xH_yF_z$ (where, x, y, and z are positive integers).

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to accompanying drawings.

First of all, a substrate processing system for performing a substrate processing method in accordance with an embodiment of the present invention will be described. The substrate processing system includes a plurality of process modules configured to perform an etching process or an ashing process using plasma on a semiconductor wafer W (hereinafter, simply referred to as "wafer W") as a substrate.

Figure 1:
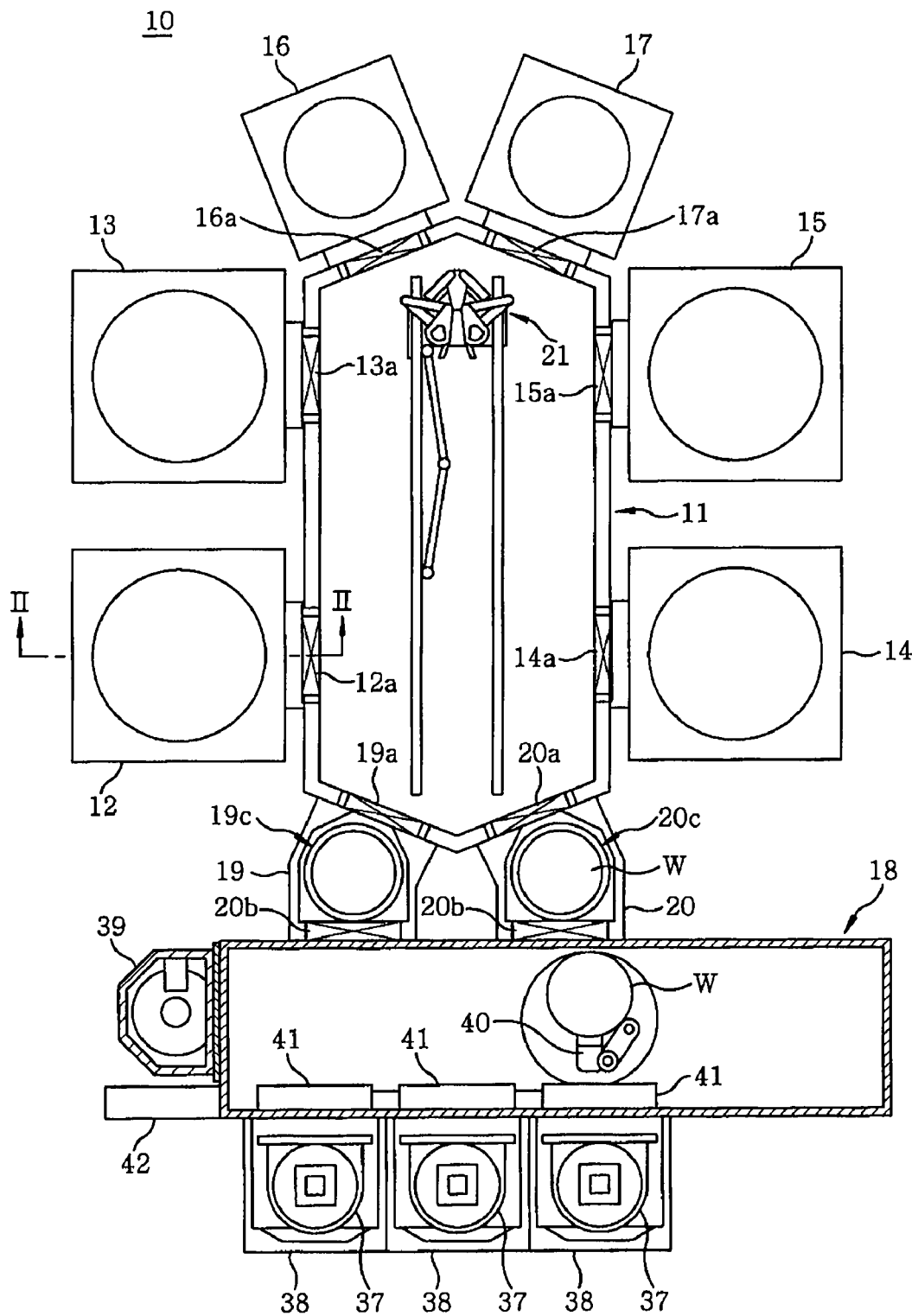
FIG. 1 is a plan view schematically illustrating a configuration of a substrate processing system that performs a substrate processing method according to an embodiment of the present invention.

FIG. 1 is a plan view schematically illustrating a configuration of the substrate processing system that performs the substrate processing method in accordance with the embodiment of the present invention.

Referring to FIG. 1, the substrate processing system 10 includes a transfer module 11 having a hexagonal shape as seen from the top side, two process modules 12 and 13 connected to a side surface of the transfer module 11, two process modules 14 and 15 connected to another side surface of the transfer module 11 opposite to the two process modules 12 and 13, a process module 16 connected to the transfer module 11 to be adjacent to the process module 13, a process module 17 connected to the transfer module 11 to be adjacent to the process module 15, a rectangular loader module 18 serving as a transfer chamber, and two load lock modules 19 and 20 arranged between the transfer module 11 and the loader module 18 to connect the transfer module 11 and the loader module 18 to each other.

The transfer module 11 includes an extensible and rotatable transfer arm 21 which is arranged therein. The transfer arm 21 transfers a wafer W between the transfer module 11 and the process modules 12 to 17 or the load lock modules 19 and 20.

The process module 12 includes a processing chamber 22 (see FIG. 2) for accommodating the wafer W therein. A mixed gas of a CF-based gas, e.g., $CF_4$ gas, and $O_2$ gas, as a processing gas, is introduced into the chamber, plasma is generated from the introduced processing gas by creating an electric field in the chamber, and the wafer W is etched by the plasma.

Figure 2:
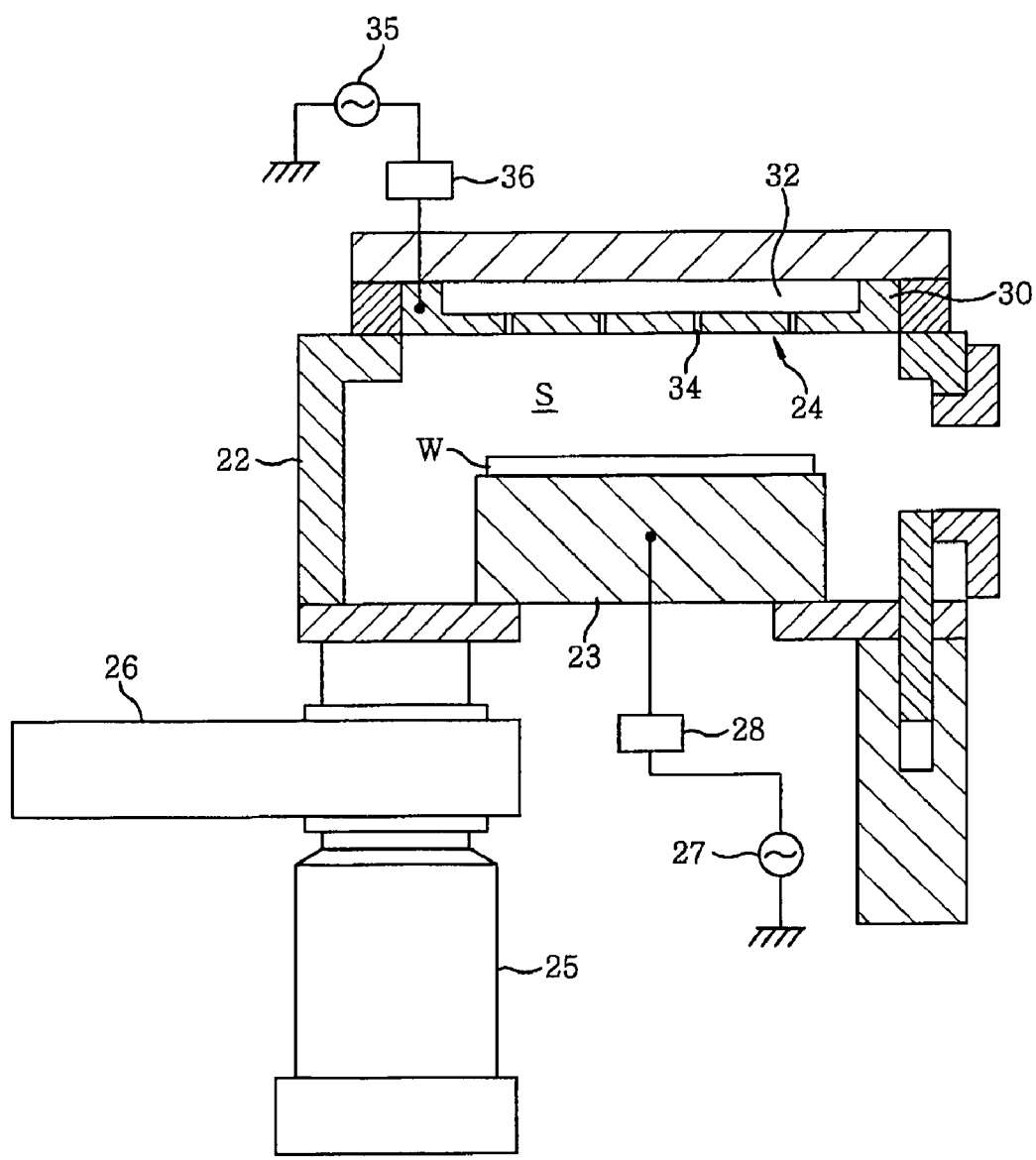
FIG. 2 is a cross section view taken along line II-II in FIG. 1.

FIG. 2 is a cross section view taken along line II-II in FIG. 1.

Referring to FIG. 2, the process module 12 further includes a mounting table 23 for the wafer W, which is arranged in the processing chamber 22, a shower head 24 arranged at an upper side of the chamber 22 to face the mounting table 23, a TMP (Turbo Molecular Pump) 25 for exhausting gases in the chamber 22, and an APC (Adaptive Pressure Control) valve 26 as a variable butterfly valve, which is arranged between the chamber 22 and the TMP 25 to control the pressure in the chamber 22.

A high frequency power supply 27 is connected to the mounting table 23 via a matcher 28 to supply high frequency power to the mounting table 23. By doing so, the mounting table 23 functions as a lower electrode. In addition, the matcher 28 reduces the reflection of the high frequency power from the mounting table 23 so that the supply efficiency of the high frequency power to the mounting table 23 is maximized. The mounting table 23 applies the high frequency power supplied from the high frequency power supply 27 to a processing space S.

The shower head 24 is constituted as a gas supply unit 30 shaped as a circular plate. The gas supply unit 30 has a buffer chamber 32. The buffer chamber 32 communicates with the inside of the chamber 22 via gas injection holes 34.

The buffer chamber 32 is connected to a $CF_4$ gas supply system and an $O_2$ gas supply system (both are not shown). The $CF_4$ gas supply system supplies $CF_4$ gas to the buffer chamber 32. And, the $O_2$ gas supply system supplies $O_2$ gas to the buffer chamber 32. The $CF_4$ gas and the $O_2$ gas are then supplied to the chamber 22 via the gas injection holes 34.

A high frequency power supply 35 is connected to the shower head 24 via a matcher 36 to supply high frequency power to the shower head 24. By doing so, the shower head 24 functions as an upper electrode. In addition, the matcher 36 has the same function as that of the matcher 28. The shower head 24 applies high frequency power supplied from the high frequency power supply 35 to the processing space S.

In the chamber 22 of the process module 12, as described above, the mounting table 23 and the shower head 24 apply high frequency powers to the processing space S so that the processing gas supplied from the shower head 24 to the processing space S is converted to plasma and ions or radicals are generated, and then a step of etching an intermediate layer is performed as described later.

Returning to FIG. 1, the process module 13 includes a processing chamber for accommodating the wafer W that experienced a step of etching the intermediate layer in the process module 12. A mixed gas of $CH_3F$ gas and $SF_6$ gas as a processing gas is introduced into the chamber, forms an electric field is generated in the chamber to generate plasma from the introduced processing gas, and performs a step of increasing the thickness of the mask layer is performed on the wafer W by using the plasma as described later. Further, the process module 13 has the same configuration as that of the process module 12, and includes a $CH_3F$ gas supply system and an $SF_6$ gas supply system (both are not shown).

A step of etching an SiN film is performed on the wafer W in which the mask layer has been thickened. However, if the step of increasing the thickness of the mask layer by attaching deposits and the step of etching the SiN film are both performed in the same chamber, the deposits in the step of increasing the thickness of the mask layer would hamper the etching of the SiN film. Thus, in this embodiment, the step of etching the SiN film is carried out by the process module 15. The process module 15 has also the same configuration as that of the process module 12.

The process module 14 includes a processing chamber for accommodating the wafer W that has been subjected to the etching process in the process module 15. $O_2$ gas as a processing gas is introduced into the chamber, an electric field is generated in the chamber to generate plasma from the introduced processing gas, and an ashing process is performed on the wafer W by the plasma. Further, the process module 14 also has the same configuration as that of the process module 12 and includes a shower head (not shown) constituted of only a gas supply unit (not shown) shaped as a circular plate, in which an $O_2$ supply system (not shown) is connected to the buffer chamber (not shown), instead of the shower head 24 constituted of the gas supply unit 30 connected to the various gas supply systems.

The insides of the transfer module 11 and the process modules 12 to 17 are kept in a depressurized state. The process modules 12 to 17 are connected to the transfer module 11 via vacuum gate valves 12a to 17a, respectively.

In the substrate processing system 10, the inner pressure of the loader module 18 is maintained at an atmospheric pressure while the inner pressure of the transfer module 11 is maintained vacuum. Accordingly, the load lock modules 19 and 20 include vacuum gate valves 19a and 20a, respectively, at which the load lock modules 19 and 20 are connected to the transfer module 11, and atmospheric door valves 19b and 20b, respectively, at which the load lock modules 19 and 20 are connected to the loader module 18. As such, the load lock modules 19 and 20 serve as a preliminary vacuum transfer chamber that may adjust the inner pressure. Further, the load lock modules 19 and 20, respectively, have wafer mounting tables 19c and 20c to temporarily mount thereon the wafer W that is transferred between the loader module 18 and the transfer module 11.

Besides the load lock modules 19 and 20, e.g., three FOUP (Front Opening Unified Pod) mounting tables 38 for mounting FOUPs 37 as vessels for accommodating, e.g., twenty five wafers W and an orienter 39 for pre-aligning the orientation of the wafers W unloaded from the FOUPs 37 are connected to the loader module 18.

The load lock modules 19 and 20 are connected to one longer sidewall of the loader module 18 and arranged opposite to the three FOUP mounting tables 38 with the loader module 18 located therebetween, and the orienter 39 is arranged at one longitudinal end of the loader module 18.

The loader module 18 includes therein a scalar dual-arm type transfer arm 40 for transferring the wafer W and three load ports 41, as input ports for the wafers W, arranged at the other sidewall thereof correspondingly to the respective FOUP mounting tables 38. The transfer arm 40 takes the wafers W out from the FOUPs 37 mounted on the FOUP mounting tables 38 via the load ports 41, and transfer the wafers W taken out to the load lock modules 19 and 20 or the orienter 39.

Further, the substrate processing system 10 includes an operation panel 42 arranged at the longitudinal end of the loader module 18. The operation panel 42 includes a display unit such as, e.g., an LCD (Liquid Crystal Display), which displays operational situations of each component of the substrate processing system 10.

Figure 3:
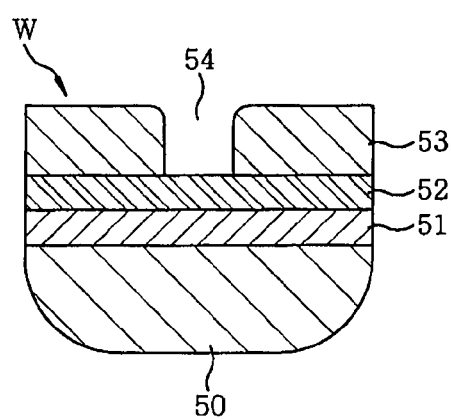
FIG. 3 is a cross section view schematically illustrating a configuration of a semiconductor wafer on which plasma processing is performed by the substrate processing system shown in FIG. 1.

FIG. 3 is a cross section view schematically illustrating a configuration of a semiconductor wafer on which plasma processing is performed in the substrate processing system shown in FIG. 1.

Referring to FIG. 3, the wafer W includes an SiN film 51 formed as a processing target layer on a silicon base 50, an antireflection film (BARC film) 52 formed on the SiN film 51, and a photoresist film (mask layer) 53 formed on the BARC film 52.

The silicon base 50 is a thin film that is formed of silicon and shaped as a circular plate. The SiN film 51 is formed on the silicon base 50 by performing, e.g., a CVD process or the like on the surface of the silicon base 50. The BARC film 52 is formed on the SiN film 51, e.g., by a coating process. The BARC film 52 is made of a high-molecule resin containing a pigment that absorbs a specific wavelength of light, e.g., an ArF excimer laser beam irradiated toward the photoresist film 53. The BARC film 52 prevents an ArF excimer laser beam passing through the photoresist film 53 from being reflected by the SiN film 51 to reach the photoresist film 53 again. The photoresist film 53 is formed on the BARC film 52, e.g., by using a spin coater (not shown). The photoresist film 53 is formed of a positive type photosensitive resin and transformed to be alkali-soluble when being irradiated with an ArF excimer laser beam.

In the wafer W as configured above, when an ArF excimer laser beam corresponding to a pattern converted to have a predetermined pattern is irradiated to the photoresist film 53 by a stepper (not shown), a portion of the photoresist film 53 which is irradiated with the ArF excimer laser beam is transformed to be alkali-soluble. Thereafter, a developing solution which is a strong alkali is dropped to the photoresist film 53 so that the portion of the photoresist film 53 transformed to be alkali-soluble is removed. By doing so, a portion of the photoresist film 53 corresponding to a pattern converted to have a predetermined pattern is removed from the photoresist film 53, and thus the remaining photoresist film 53 on the wafer W has the predetermined pattern having openings at locations where, e.g., via holes are formed.

Meanwhile, it is required to form an opening (via hole or trench) with a small dimension, specifically, an opening having a width (CD (Critical Dimension)) of about 30 nm on the etching target film in order to satisfy the requirement of scaling-down for miniaturization of semiconductor devices. For this purpose, a smoother and thinner photoresist film has been adopted while shortening the wavelength of light used for the photolithography as described above. However, the smoother and thinner photoresist mask film is easily worn upon etching the BARC film 52 and fails to sufficiently exert a function as a mask layer in the etching of the SiN film 51. That is, upon etching an intermediate layer or processing target layer of a triple-layer wafer including the processing target layer, the intermediate layer, and a mask layer, for example $CF_4/CHF_3/Ar/O_2$ based gases have been conventionally used as a processing gas for selectively etching the intermediate layer or processing target layer rather than the mask layer. At the moment a mask layer is currently adopted whose thickness is, e.g., about ⅕ of that of the conventional mask layer, however, the worn amount of the mask layer is relatively increased upon etching the intermediate layer, and thus it is required to develop a technology that increases the thickness of the mask layer beforehand or recovers the thickness of worn mask layer.

The inventors studied research on the relationship among the type of processing gases for attaching deposits to the mask layer, processing conditions, and the amount of attached deposits to discover a method of increasing the thickness of the mask layers and have found that deposits are deposited on an upper surface of the photoresist film 53 by performing plasma processing on the wafer W where, for example, the SiN film 51 as a target layer, the BARC film 52, and the photoresist film 53 are deposited on the silicon base 50 one on top of another by using a mixed gas of CF based depositive gas ($C_xH_yF_z$, where, x, y, and z are positive integers) and $SF_6$ gas, thus increasing the thickness of the photoresist film 53 increased. This led to the present invention.

That is, the substrate processing method in accordance with the present invention is directed to a substrate processing method that processes a substrate in which a processing target layer, an intermediate layer, and a mask layer are deposited one on top of another, wherein the mask layer has an opening through which the intermediate layer is partially exposed. The substrate processing method according to the present invention is characterized by including a step of increasing the thickness of the mask layer, wherein the thickness of the mask layer is increased by depositing deposits on an upper surface of the mask layer with the opening by using plasma generated from a mixed gas of a depositive gas whose general equation is represented as $C_xH_yF_z$ (where, x, y, and z are positive integers) and $SF_6$ gas.

Here, the "depositive gas" refers to a gas that has a function to increase the thickness of the photoresist film 53 as a mask layer or decrease the width of the opening by depositing deposits on the upper surface of the photoresist film 53 or sidewall surface of the opening.

Hereinafter, a substrate processing method in accordance with embodiments of the present invention will be described in more detail with reference to accompanying drawings.

The substrate processing method includes a step of increasing the thickness of the mask layer wherein the thickness of the photoresist film 53 is increased by depositing deposits on an upper surface of the photoresist film 53 included in the wafer W based on plasma processing.

FIGS. 4A to 6B are views illustrating a substrate processing method in accordance with an embodiment of the present invention.

Figure 4A:
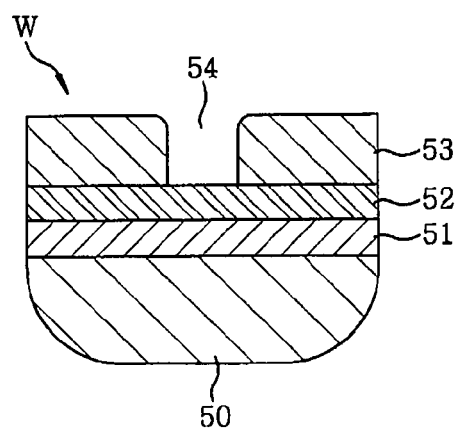
FIGS. 4A to 4D are views illustrating the substrate processing method according to the embodiment of the present invention.
Figure 4B:
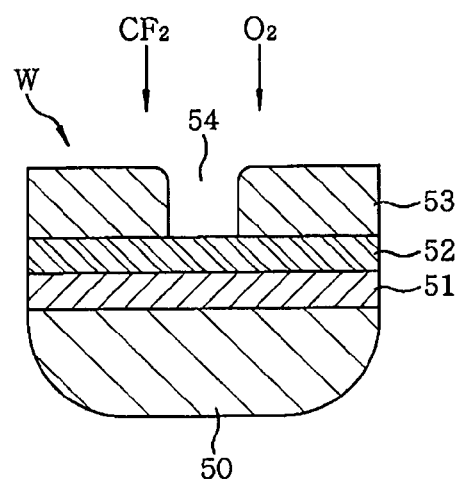

Referring to FIGS. 4A to 4B, first, the wafer W is prepared in which the SiN film 51, the BARC film 52, and the photoresist film 53 are stacked on the silicon base 50 one on top of another (FIG. 4A). The thickness of the SiN film 51, the thickness of the BARC film 52, and the thickness of the photoresist film 53 may be, for example, 100 nm, 80 nm, and 90 nm, respectively. The photoresist film 53 has the opening 54 whose width may be, for example, 45 nm (pitch of 90 nm). The wafer W is transferred in the chamber 22 of the process module 12 (refer to FIG. 2) and mounted on the mounting table 23.

Figure 4C:
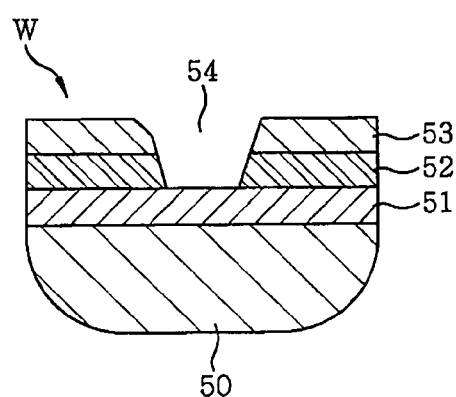

Next, the pressure in the chamber 22 is set to, for example, 2.6 Pa (20 mTorr) by the APC valve 26 and the like. Further, the temperature of the wafer W is set to, for example, 30° C. Further, $CF_4$ gas is supplied from the gas supply unit 30 of the shower head 24 into the chamber 22 at a flow rate of 70 sccm, and $O_2$ gas is supplied into the chamber 22 at a flow rate of 10 sccm. And, high frequency power of 50 W is applied to the mounting table 23 and high frequency power of 600 W is applied to the shower head 24. At this time, the $CF_4$ gas and the $O_2$ gas are excited by the high frequency power applied to the processing space S to be converted to plasma, and ions and radicals are created (FIG. 4B). These ions and radicals collide and react with a portion of the BARC film 52, which is not covered by the photoresist film 53, so that the portion is etched. At this time, the surface of the photoresist film 53 and inner wall surface of the opening 54 are crashed by the plasma generated by excitation of the $CF_4$ gas and the $O_2$ gas as well, and thus worn out, which reduced the thickness of the photoresist film 53 from, for example, 73 nm to 35 nm. Further, the width of the opening 54 was increased from, for example, 45 nm to 55 nm (FIG. 4C). The processing time for the step of etching the BARC film is, for example, 40 seconds.

Then, a step of increasing the thickness of the mask layer (hereinafter, referred to as "mask layer thickness recovery step (SM step)") is performed on the photoresist film 53 to recover the thickness of the worn photoresist film 53 of the wafer W.

Figure 4D:
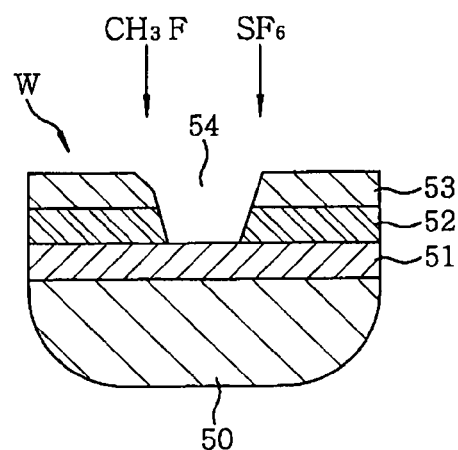

That is, the wafer W in which the photoresist film 53 has been worn is unloaded from the chamber 22 of the process module 12, loaded in the chamber of the process module 13 via the transfer module 11, and then mounted on the mounting table 23. Thereafter, the pressure in the chamber 22 of the process module 13 is set to, for example, 2.6 Pa (20 mTorr) by the APC valve 26 and the like and the temperature of the wafer W is set to, for example, 30° C. Then, $CH_3F$ gas is supplied from the gas supply unit 30 of the shower head 24 into the chamber 22 at a flow rate of 200 sccm while $SF_6$ gas is supplied to the chamber 22 at a flow rate of 300 sccm. And, high frequency power of 100 W is applied to the mounting table 23 while high frequency electric power of 200 W is applied to the shower head 24. At this time, a mixed gas of the $CH_3F$ gas and the $SF_6$ gas is converted to plasma by the high frequency power applied to the processing space S, and ions and radicals are created (FIG. 4D).

Figure 5A:
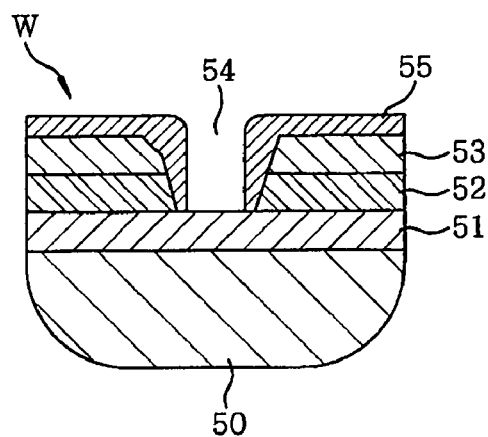
FIGS. 5A to 5D are views illustrating the substrate processing method according to the embodiment of the present invention.

These ions and radicals collide and react with the upper surface of the photoresist film 53, and thus deposits are deposited on the upper surface of the photoresist film 53, thereby recovering the thickness of the photoresist film 53 (FIG. 5A).

Since the processing is initiated, the thickness of the deposits is gradually increased on the upper surface of the photoresist film 53. The thickness of the deposits was found to be, for example, 60 nm 30 seconds after the initiation of the processing. That is, the thickness of the photoresist film 53 was recovered from 35 nm up to 60 nm by the mask layer recovery step (SM step). At this time, deposits are deposited even on the sidewall surface of the opening 54 so that the width of the opening 54 was decreased from, for example, 55 nm to 45 nm. The thickness of the photoresist film 53 and the width of the opening 54 vary with a processing time of the mask layer thickness recovery step. As the processing time is lengthened, the thickness of the film is increased and the width of the opening is decreased. Accordingly, the thickness of the photoresist film 53 and the width of the opening 54 may be controlled by adjusting the processing time.

Next, a breakthrough step is performed on the wafer W having the photoresist film 53 whose thickness has been recovered by the mask layer thickness recovery step to remove the deposits that are primarily formed of carbon and attached to the surface of the SiN film 51.

The reason why the breakthrough step is performed may be as follows.

The deposits are sometimes deposited on the surface of the SiN film 51, which are not coated by the BARC film 52, the photoresist film 53, and the deposits 55 deposited thereon by the mask layer thickness recovery step that recovers the thickness of the photoresist film 53 and is performed after the step of etching the BARC film 52. If the subsequent SiN film etching step is carried out with the deposits 55 attached on the SiN film 51, the etching of the SiN film 51 may be hindered since the step of etching the SiN film has a high selectivity for carbon which is a main component of the deposits 55. Accordingly, the breakthrough step is performed as a process prior to the step of etching the SiN film to sweep away the surface of the SiN film 51. In addition, it is actually unclear whether the deposits 55 are attached onto the SiN film 51 or not in the mask layer thickness recovery step, but the breakthrough step is considered not to be skipped at least to stably perform the subsequent SiN film etching step.

The breakthrough step is executed as follows. That is, the wafer W in which the thickness of the photoresist film 53 has been recovered by the mask layer thickness recovery step is unloaded from the chamber 22 of the process module 13, loaded into the chamber 22 of the process module 12 (refer to FIG. 2) via the transfer module 11, and then mounted on the mounting table 23.

Figure 5B:
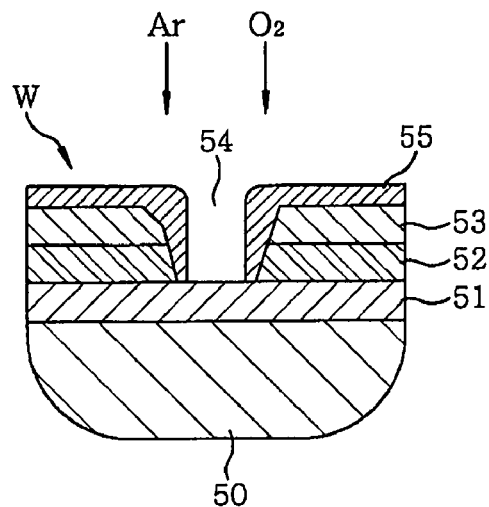

Next, the pressure in the chamber 22 is set to, for example, 2.6 Pa (20 mTorr) by the APC valve 26 and the like. Further, the temperature of the wafer W is set to, for example, 30° C. Further, Ar gas is supplied from the gas supply unit 30 of the shower head 24 to the chamber 22 at a flow rate of 200 sccm while $O_2$ gas is supplied to the chamber 22 at a flow rate of the silicon base 50 sccm. And, high frequency power of 50 W is applied to the mounting table 23 while high frequency power of 200 W is applied to the shower head 24. At this time, the Ar gas and the $O_2$ gas are excited by the high frequency power applied to the processing space S to be converted to plasma, and ions and radicals are created (FIG. 5B). These ions and radicals collide and react with a portion of the SiN film 51, which is not covered by the BARC film 52, the photoresist film 53, and the deposits 55 deposited thereon. Then, the portion of the SiN film 51 is swept out and any existent deposits are eliminated. Further, a processing time for the breakthrough step is set to, for example, 20 seconds.

Next, an SiN etching step is performed on the wafer W, in which the deposits attached to the surface of the SiN film 51 and formed mainly of carbon have been eliminated by the breakthrough step, so that the opening of the photoresist film 53 is transcribed onto the SiN film 51.

Figure 5C:
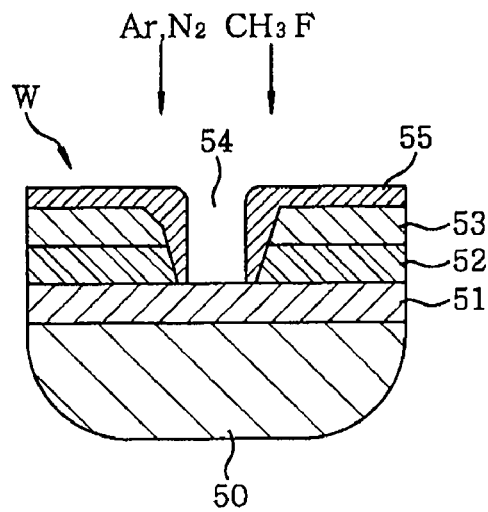

That is, the wafer W that has been subjected to the breakthrough step is unloaded from the chamber 22 of the process module 12 (refer to FIG. 2), loaded into the chamber of the process module 15 via the transfer module 11, and then mounted on the mounting table 23. Thereafter, the pressure in the chamber 22 of the process module 15 is set to, for example, 2.6 Pa (20 mTorr) by the APC valve 26 and the like, and the temperature of the wafer W is set to, for example, 30° C. Then, a mixed gas of Ar gas and $N_2$ gas which are mixed at a flow rate ratio of, for example, 3:1, is supplied to the chamber 22 at a flow rate of, for example, 800 sccm (600 sccm for Ar gas and 200 sccm for $N_2$ gas), while $CH_3F$ gas is supplied to the chamber 22 at a flow rate of, for example, 50 sccm. And, high frequency power of 600 W is applied to the mounting table 23 while high frequency power of 200 W is applied to the shower head 24. At this time, the mixed gas of Ar gas and $N_2$ gas and $CH_3F$ gas are converted to plasma by the high frequency power applied to the processing space S, and ions or radicals are created (FIG. 5C).

Figure 5D:
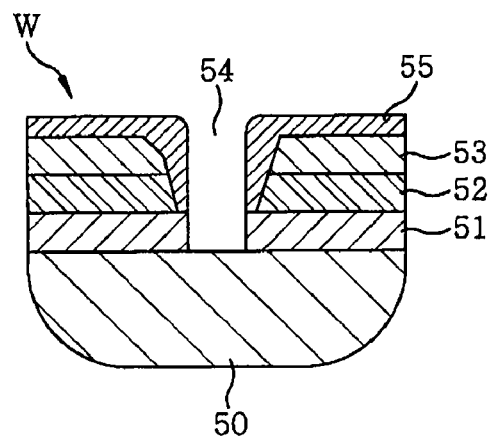

These ions and radicals collide and react with a portion of the SiN film 51 which is not covered by the BARC film 52, the photoresist film 53, and the deposits 55 deposited thereon, and then the portion of the SiN film 51 is etched (FIG. 5D). The SiN film 51 is etched until the silicon base 50 is exposed. At this time, the width of the opening 54 was 45 nm in the SiN film 51 sixty seconds after the processing was initiated.

Next, an ashing process is performed on the wafer W in which the opening 54 of the photoresist film 53 has been transcribed to the SiN film 51 by the above processes.

That is, the wafer W is unloaded from the chamber 22 of the process module 15 after the etching of the SiN film 51, loaded into the chamber 22 of the process module 14 (refer to FIG. 2) via the transfer module 11, and then mounted on the mounting table 23.

Figure 6A:
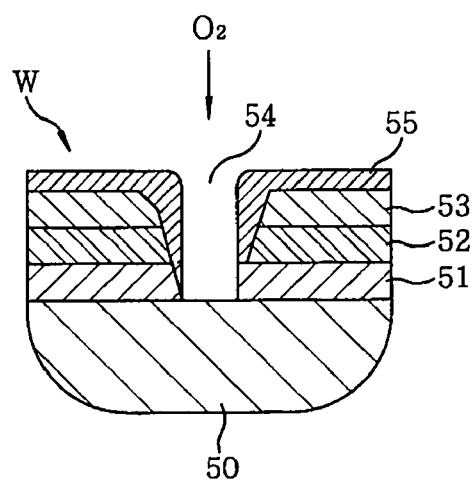
FIGS. 6A to 6B are views illustrating the substrate processing method according to an embodiment of the present invention.
Figure 6B:
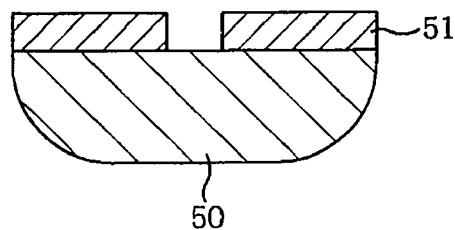

Then, the pressure in the chamber 22 of the process module 14, in which the wafer W has been loaded, is set to, for example, 1.3×10 Pa (100 mTorr) by the APC valve 26 or the like. And, the temperature of the wafer W is adjusted to, for example, 30° C., and then $O_2$ gas is supplied from the gas supply unit 30 of the shower head 24 to the chamber at a flow rate of 374 sccm. And, high frequency power of 0 to 30 W is applied to the mounting table 23 while high frequency power of 600 W is applied to the shower head 24. At this time, $O_2$ gas is converted to plasma by the high frequency power applied to the processing space S, and ions and radicals are created (FIG. 6A). The BARC film 52, the photoresist film 53, and the deposits 55 deposited on an upper surface of the photoresist film 53 and sidewalls of the opening 54, which are stacked on the SiN film 51, are ashed by the created ions and radicals. By doing so, the BARC film 52, the photoresist film 53, and the deposits 55 deposited on the upper surface of the photoresist film 53 and the sidewall surface of the opening 54 are removed (FIG. 6B).

Twenty to ninety seconds after the ashing process was initiated, the width of an upper part of the opening 54 in the SiN film 51 of the wafer W was 45 nm. Thereafter, the wafer W was unloaded from the chamber of the process module 14 and then the process was ended.

According to the embodiment, the thickness of the photoresist film 53, which was worn during the step of etching the BARC film 52, can be recovered by performing plasma processing using a mixed gas of $CH_3F$ gas, which is a depositive gas, and $SF_6$ gas after the etching of the BARC film 52.

That is, when the BARC film 52 is etched, the photoresist film 53 smoother than the BARC film 52 is thus worn in such a manner that the width of an upper part of the opening 54 becomes wider than the width of a lower part of the opening 54 or sidewall of the opening is formed in a tapered shape so that the width of the photoresist film 53 becomes narrow as it goes upward. If the photoresist film 53 is left worn, it is impossible to etch the SiN film 51 such that the opening thereof has an inner wall surface extending straight vertically.

In this embodiment, the thickness of the photoresist film 53 was recovered by depositing or attaching deposits to the surface of the worn photoresist film 53, particularly a tapered portion of the worn photoresist film 53 by performing plasma processing using a mixed gas of $CH_3F$ gas, which is a depositive gas, and $SF_6$ gas. At this time, since the deposits are deposited on the surface of the photoresist film 53 particularly on the tapered portion thereof, the deposits are attached, for example, around a tip of the upwardly tapered portion, e.g., in an "afro hair" form in the step of etching the BARC film 52, so that the thickness and width are recovered.

According to the embodiment, the thickness of the photoresist film 53 can be recovered. Accordingly, the processability of the wafer W can be significantly enhanced by applying the embodiment to the wafer W including the thin, smooth photoresist film 53 and the solid BARC film 52, which makes it possible to etch a SiN film thicker than the conventional art.

The step of increasing the thickness of the mask layer according to the embodiment uses a mixed gas of a depositive gas and $SF_6$ gas as a processing gas, wherein $CH_3F$ gas is preferably utilized as the depositive gas. Because of a number of hydrogen atoms, $CH_3F$ gas easily reacts with the photoresist film 53 and allows deposits to be effectively deposited on the upper surface of the photoresist film 53, so that the thickness of the photoresist film 53 may be increased. $SF_6$ gas serves to smooth the surface of the photoresist film 53.

In the embodiment, a mixing ratio of $SF_6$ gas with respect to $CH_3F$ gas is preferably equal to or less than 1.5, and more preferably range from about 1 to about 1.5. For example, when the supply amount of $CH_3F$ gas is 200 sccm, the supply amount of $SF_6$ gas is set to be equal to or less than 300 sccm.

When the flow rate of $SF_6$ gas with respect to $CH_3F$ gas is excessively small, the deposits are deposited even onto the surface of the SiN film 51, whereas the amount of the deposits attached on the surface of the photoresist film 53 is deficient when the flow rate is too large, which causes the thickness of the photoresist film 53 to be insufficiently recovered. When the flow rate ratio of $CH_3F$ gas and $SF_6$ gas falls within the above range, the deposit attachment operation of $CH_3F$ gas is balanced with the deposit control operation or smoothing operation of $SF_6$ gas, so that the thickness of the photoresist film 53 may be effectively recovered without the deposits being attached to the SiN film.

Although $SF_6$ gas is considered as a gas for exerting an etching effect thanks to a large percentage of fluorine, $SF_6$ gas contains sulfur (S) so that the deposit attachment operation is shown by S-based reaction product. By this, the smoothing effect is considered to be exerted, which prevents the upper surface of the photoresist film 53 from being roughened and worn.

In the embodiment, the bias power for the mask layer thickness recovery step is preferably about 50 W to 200 W. When the bias power is less than 50 W, the deposits are insufficiently attached onto the surface of the photoresist film 53. On the other hand, when the bias power exceeds 200 W, the photoresist film 53 is easily roughened due to sputtering. A temperature for substrate processing is not particularly limited, but practically preferably range from about 20° C. to about 100° C. Further, the power (source power) for generating plasma is not particularly limited, but may be changed, for example, depending on the apparatus used.

In the embodiment, the pressure in the chamber preferably may range from about 2 Pa (15 mTorr) to about 5.2 Pa (40 mTorr) in the mask layer thickness recovery step. When the processing pressure is too low, the surface of the substrate is easily roughened. On the other hand, when the processing pressure is too high, the surface of the substrate is easily worn.

In the embodiment, the processing time for the mask layer thickness recovery step is, for example, from 20 seconds to 40 seconds. A speed at which the deposits are attached onto the surface of the photoresist film 53 is highest at the beginning of processing, and then gradually lowered since the speed is nearly converged after about 30 seconds.

In the embodiment, although the mechanism of recovering the thickness of the photoresist film 53 is not necessarily clear, it is considered that the deposit deposition operation by $CH_3F$ gas may be balanced with the deposit control operation or smoothing operation by $SF_6$ gas by adjusting the flow rate ratio of $SF_6$ gas respective of $CH_3F$ gas, the bias power, and the processing pressure within the above-mentioned respective ranges in the mask layer thickness recovery step. By doing so, the deposits may be selectively attached onto the upper surface of the photoresist film 53, so that the thickness of the photoresist film 53 worn during the etching of the BARC film 52 can be recovered.

In the embodiment, a gas containing a halogen element, such as chlorine (Cl), bromine (Br), iodine (I) and fluorine (F) may be adopted instead of $SF_6$ gas. Further, another gas containing S, Cl, Br, and I but not F may also be used as long as the gas provides the similar operation and effects.

In the embodiment, the flow rates of Ar gas, $N_2$ gas, and $CH_3F$ gas are preferably 300 to 900 sccm, 100 to 300 sccm, and 50 to 150 sccm, respectively, in the step of etching the SiN film 51 subsequent to the mask layer thickness recovery step.

Here, the step of etching the SiN film 51 is primarily performed by Ar gas. $CH_3F$ gas exerts an effect (selectivity) of depositing the deposits to control the etching speed by Ar gas. $N_2$ gas controls the amount of attached deposits by $CH_3F$ gas.

In the embodiment, although it has been exemplified that the processing target film is the SiN film 51, the processing target film is not limited thereto. For example, the processing target film may be a TiN film, or others. Further, although the BARC film 52 has been used as the intermediate film, the intermediate film is not limited to the BARC film.

In the embodiment, although there has been described the case where process modules are changed and separate chambers are used for each and every process, the processes may be sequentially carried out in the same chamber. By performing the processes in the same chamber, the transfer time of the wafer W can be shortened as well as costs for facilities can be reduced.

In the embodiment, the step of increasing the thickness of the mask layer was performed after the BARC film 52 of the wafer W was etched in order to recover the thickness of the photoresist film 53 worn by the etching of the BARC film 52. However, the step of increasing the thickness of the mask layer may be carried out before the BARC film 52 is etched so as to increase the thickness of the photoresist film 53 in advance so that the step of etching the BARC film 52 is applied to the wafer W in which the photoresist film 53 has been thickened. This may also remove the influence caused when the photoresist film 53 is worn so that the SiN film 51 may be etched well.

In the embodiment, the substrate on which plasma processing is performed is not limited to the wafer for semiconductor devices, but various substrates used for LCDs (Liquid Crystal Displays) or FPDs (Flat Panel Displays) or photomask, CD substrates, or print boards may be used.

Further, another aspect of the present invention may be also accomplished by supplying a storage medium that stores program codes of software executing the functions suggested in the above-mentioned embodiment to a system or apparatus, so that a computer (or CPU, or MPU) included in the system or apparatus reads and executes the program codes stored in the storage medium.

In this case, the program codes themselves read from the storage medium are configured to implement the above-described functions of the embodiment, and the program codes and the storage medium storing the program codes constitute the present invention.

Further, the storage medium for supplying the program codes may include, for example, floppy (trade mark) discs, hard discs, magneto-optical discs, optical discs such as CD-ROM, CD-R, CD-RW, DVD-ROM, DVD-RAM, DVD-RW, or DVD+RW, magnetic tapes, non-volatile memory cards, ROMs, etc. Or, the program codes may be downloaded over a network.

Further, the present invention also includes a case where the above-mentioned functions of the embodiment are implemented by executing the program codes read by the computer, and a part or entirety of actual processes is executed by an OS (Operating System) operated in the computer based on the instructions of the program codes, whereby the above-mentioned functions of the embodiment are realized.

Further, the present invention also includes a case where the program codes read from the storage medium is written to a memory provided to a function expansion unit connected to the computer or a function extension board inserted into the computer, and then a part or entirety of actual processes for an extended function is executed by a CPU provided to the extension board or extension unit based on the instructions of the program codes, whereby the above-mentioned functions of the embodiment are realized. According to the substrate processing method of the present invention, there is provided the step of increasing the thickness of the mask layer by depositing deposits on the upper surface of the mask layer with an opening by using plasma generated from a mixed gas of a depositive gas represented as a general equation $C_xH_yF_z$ (where, x, y, and z are positive integers) and $SF_6$, so that the thickness of the mask layer can be increased as necessary.

The step of increasing the thickness of the mask layer is a step of recovering the thickness of the worn mask layer by etching the BARC film as an intermediate layer. Accordingly the thickness of the worn mask layer can be recovered by the step of etching the intermediate layer.

The step of increasing the thickness of the mask layer is performed before the intermediate layer is etched, so that the thickness of the mask layer can be increased before the mask layer is worn, thereby making subsequent processes stable.

The depositive gas is $CH_3F$, so that deposits based on $CH_3F$ can be deposited on the upper surface of the mask layer, which increase the thickness of the mask layer.

The mixing ratio of $SF_6$ with respect to the depositive gas is set to be equal to or less than 1.5, so that a deposit deposition operation by the depositive gas, and a deposit control operation and a smoothing operation of the surface of the mask layer by $SF_6$ can cause a synergy effect, which allows the deposits to be selectively attached onto the surface of the mask layer, thereby increasing the thickness of the mask layer.

The mixing ratio of $SF_6$ with respect to the depositive gas is set to be from 1 to 1.5, and thus the deposits can be selectively attached to the surface of the mask layer, thereby effectively increasing the thickness of the mask layer.

Bias electric power of 50 W to 200 W is applied to the substrate in the step of increasing the thickness of the mask layer, so that the deposits can be selectively attached to the surface of the mask layer in combination with a gas mixing ratio and a processing pressure, thereby effectively increasing the thickness of the mask layer.

The pressure of the atmosphere surrounding the substrate is adjusted to be from 2.0 Pa (15 mTorr) to 5.2 Pa (40 mTorr) in the step of increasing the thickness of the mask layer, so that the deposits can be effectively attached to the surface of the mask layer in combination with the bias electric power and the processing gas mixing ratio, thereby increasing the thickness of the mask layer.

The processing time is set to be from 20 seconds to 40 seconds in the step of increasing the thickness of the mask layer, so that the deposits can be attached to the surface of the mask layer within a minimum processing time as necessary, thereby increasing the thickness of the mask layer.

The mask layer is a photoresist film in the step of increasing the thickness of the mask layer, so that the deposits are attached to the surface of the photoresist film to increase the thickness of the photoresist film.

While the invention has been shown and described with respect to the embodiments, it will be understood by those skilled in the art that various changes and modification may be made without departing from the scope of the invention as defined in the following claims.

What is claimed is:

1. A substrate processing method comprising:
    obtaining a substrate in which a processing target layer, an intermediate bottom antireflection coating (BARC) layer, and a mask layer are stacked one on top of another, the mask layer including a photoresist film having an opening that partially exposes the BARC layer;
    increasing a thickness of the mask layer by depositing deposits on an upper surface of the mask layer with plasma generated from a first gas;
    etching the BARC layer exposed through the opening with plasma generated from a second gas so that a surface of the processing target layer is partially exposed through the opening; and
    etching the processing target layer exposed through the opening,
    wherein the first gas is a gaseous mixture of $SF_6$ gas and a depositive gas represented in a general equation $C_xH_yF_z$, where x, y, and z are positive integers, and
    wherein a composition of the second gas is different from a composition of the first gas.

2. A substrate processing method comprising:
    obtaining a processing target layer, an intermediate layer, and a mask layer are stacked one on top of another, the mask layer having an opening that partially exposes the intermediate layer;
    increasing a thickness of the mask layer by forming deposits on an upper surface of the mask layer having the opening with plasma generated from a gaseous mixture of $SF_6$ gas and a depositive gas represented in a general equation, $C_xH_yF_z$ where, x, y, and z are positive integers;
    etching the intermediate layer exposed through the opening so that a surface of the processing target layer is partially exposed by the opening;
    removing, after said increasing the thickness of the mask layer, deposits attached to a portion of the surface of the processing target layer, the portion being exposed through the opening; and
    etching, after said removing the attached deposits, the exposed portion of the processing target layer.

3. The substrate processing method of claim 1, wherein said increasing the thickness of the mask layer includes recovering a thickness of the mask layer worn when the BARC layer is etched.

4. The substrate processing method of claim 3, wherein the second gas is a gaseous mixture of $CF_4$ gas and $O_2$ gas.

5. The substrate processing method of claim 1, wherein said increasing the thickness of the mask layer is performed before starting to etch the BARC layer.

6. The substrate processing method of claim 5, wherein the second gas is a gaseous mixture of $CF_4$ gas and $O_2$ gas.

7. The substrate processing method of claim 1, wherein the depositive gas is $CH_3F$ gas.

8. The substrate processing method of claim 7, wherein, when said etching the processing target layer is performed, the processing target layer is etched with plasma generated from a gaseous mixture of Ar gas, $N_2$ gas, and $CH_3F$ gas.

9. The substrate processing method of claim 1, wherein a mixing ratio of $SF_6$ gas with respect to the depositive gas is greater than zero and equal to or less than about 1.5.

10. The substrate processing method of claim 9, wherein the mixing ratio of $SF_6$ gas with respect to the depositive gas is from about 1 to about 1.5.

11. The substrate processing method of claim 9, wherein the mixing ratio of $SF_6$ gas with respect to the depositive gas is from 1 to 1.5.

12. The substrate processing method of claim 1, further comprising, after said increasing the thickness of the mask layer, removing deposits attached to a portion of the surface of the processing target layer during said increasing the thickness of the mask layer, the portion being exposed through the opening.

13. The substrate processing method of claim 12, wherein, when said removing the deposits is performed, the deposits are removed with plasma generated form a gaseous mixture of Ar gas and $O_2$ gas.

14. The substrate processing method of claim 1, wherein the second gas is a gaseous mixture of $CF_4$ gas and $O_2$ gas.

15. The substrate processing method of claim 1, wherein, when said etching the processing target layer is performed, the processing target layer is etched with plasma generated from a gaseous mixture of Ar gas, $N_2$ gas, and $CH_3F$ gas.

16. The substrate processing method of claim 2, wherein the depositive gas is $CH_3F$ gas.

17. The substrate processing method of claim 2, wherein a mixing ratio of $SF_6$ gas with respect to the depositive gas is from 1 to 1.5.

18. The substrate processing method of claim 2, wherein, when said etching the intermediate layer is performed, the intermediate layer is etched with plasma generated from a gaseous mixture of $CF_4$ gas and $O_2$ gas.

19. The substrate processing method of claim 2, wherein, when said etching the exposed portion of the processing target layer is performed, the exposed portion of the processing target layer is etched with plasma generated from a gaseous mixture of Ar gas, $N_2$ gas, and $CH_3F$ gas.

20. The substrate processing method of claim 2, wherein, when said removing the deposits is performed, the deposits are removed with plasma generated form a gaseous mixture of Ar gas and $O_2$ gas.

* * * * *